United States Patent [19]
Vines et al.

[11] Patent Number: 5,989,948
[45] Date of Patent: Nov. 23, 1999

[54] METHODS OF FORMING PAIRS OF TRANSISTORS, AND METHODS OF FORMING PAIRS OF TRANSISTORS HAVING DIFFERENT VOLTAGE TOLERANCES

[75] Inventors: Landon Vines; Hunter Brugge, both of San Antonio, Tex.

[73] Assignee: VLSI Technology, Inc., San Jose, Calif.

[21] Appl. No.: 08/934,831

[22] Filed: Sep. 22, 1997

[51] Int. Cl.$^6$ .............................................. H01L 21/8238
[52] U.S. Cl. .................... 438/216; 438/217; 438/275; 438/753
[58] Field of Search .................... 438/199, 216, 438/217, 275, 276, 287, 745, 756, 753, 906

[56] References Cited

U.S. PATENT DOCUMENTS

| | | | |
|---|---|---|---|
| 5,047,816 | 9/1991 | Cuevas | 357/23.14 |
| 5,498,578 | 3/1996 | Steele et al. | 437/235 |
| 5,821,172 | 10/1998 | Gilmer et al. | 438/769 |

*Primary Examiner*—Joni Chang
*Attorney, Agent, or Firm*—Wells, St. John, Roberts, Gregory & Matkin, P.S.

[57] ABSTRACT

The invention encompasses methods of forming pairs of transistor gates. In one aspect, the invention includes a method comprising: a) defining a first region and a second region of a substrate; the first region and second region comprising a first substrate surface and a second substrate surface, respectively; b) improving a lifetime of a low voltage tolerant transistor formed proximate the first substrate surface by cleaning the first substrate surface with a first mixture comprising hydrofluoric acid and hydrochloric acid; c) forming a first transistor gate over the first substrate region and incorporating the first transistor gate into the low-voltage tolerant transistor; and d) forming a second transistor gate over the second substrate region and incorporating the second transistor rate into a high-voltage tolerant transistor. In another aspect, the invention includes a method comprising: a) defining a first region and a second region of a substrate; the first region and second region comprising a first substrate surface and a second substrate surface, respectively; b) cleaning at least one of the first and second substrate surfaces with a first mixture comprising hydrofluoric acid and hydrochloric acid; c) after cleaning the at least one of the first and second substrate surfaces, forming a first oxide layer over the first and second substrate surfaces; d) removing the first oxide layer from over the first substrate surface while leaving the first oxide layer over the second substrate surface; and e) forming a second oxide layer over the first substrate surface.

35 Claims, 5 Drawing Sheets

METHODS OF FORMING PAIRS OF TRANSISTORS, AND METHODS OF FORMING PAIRS OF TRANSISTORS HAVING DIFFERENT VOLTAGE TOLERANCES

TECHNICAL FIELD

The present invention pertains to methods of forming pairs of transistor gates. The invention has particular application to methods of forming pairs of transistor gates wherein the individual transistor gates have differing voltage tolerances.

BACKGROUND OF THE INVENTION

The present invention concerns the fabrication of integrated circuits. The invention pertains particularly to reliable processes for forming gates with differing gate oxide thicknesses.

For integrated circuits which utilize 3.3-volt technology, the nominal power supply is at 3.3 volts. The signals can switch between 3.3 volts and 0 volts. When constructing an integrated circuit which uses 3.3-volt technology, it is often desirable that some of the transistors on the integrated circuit be able to tolerate placement of 5-volt signals. Such transistors can be utilized for input/output (I/O) cells of the integrated circuit. When the gate oxide thickness for the 3.3-volt technology cannot support 5-volt operation, a dual gate oxide process is used. That is, the thickness of the gate oxide for transistors in the core of the integrated circuit is thinner than the gate oxide for transistors in the I/O cells of the integrated circuit.

Dual gate oxide fabrication processes generally involve several steps of applying and stripping photoresist and other materials from a substrate surface during formation of gate oxide. Frequently, metals and other contaminants are introduced at the substrate surface during such processing. The contaminants can decrease a lifetime of a transistor formed over the contaminated surface. Accordingly, it is desirable to develop cleaning processes which can remove metals and other contaminants from a substrate surface, and to apply such cleaning processes to dual gate oxide fabrication processes.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention encompasses a method of forming a pair of transistors comprising:

providing a substrate;

defining a first region and a second region of the substrate; the first region being a low-voltage tolerant gate region and the second region being a high-voltage tolerant gate region; the first region and second region comprising a first substrate surface and a second substrate surface, respectively;

improving a lifetime of a low voltage tolerant transistor formed proximate the first substrate surface by cleaning the first substrate surface with a first mixture comprising hydrofluoric acid and hydrochloric acid;

forming a first transistor gate over the first substrate region and incorporating the first transistor gate into the low-voltage tolerant transistor; and forming a second transistor gate over the second substrate region and incorporating the second transistor gate into a high-voltage tolerant transistor.

In another aspect, the invention encompasses a method of forming a pair of transistors comprising:

providing a substrate;

defining a first region and a second region of the substrate; the first region and second region comprising a first substrate surface and a second substrate surface, respectively;

cleaning at least one of the first and second substrate surfaces with a first mixture comprising hydrofluoric acid and hydrochloric acid;

after cleaning at least one of the first and second substrate surfaces, forming a first oxide layer over the first and second substrate surfaces;

removing the first oxide layer from over the first substrate surface while leaving the first oxide layer over the second substrate surface;

forming a second oxide layer over the first substrate surface;

after forming the second oxide layer, forming a first transistor gate over the first substrate region; and after forming the first oxide layer, forming a second transistor gate over the second substrate region.

Figure 1:
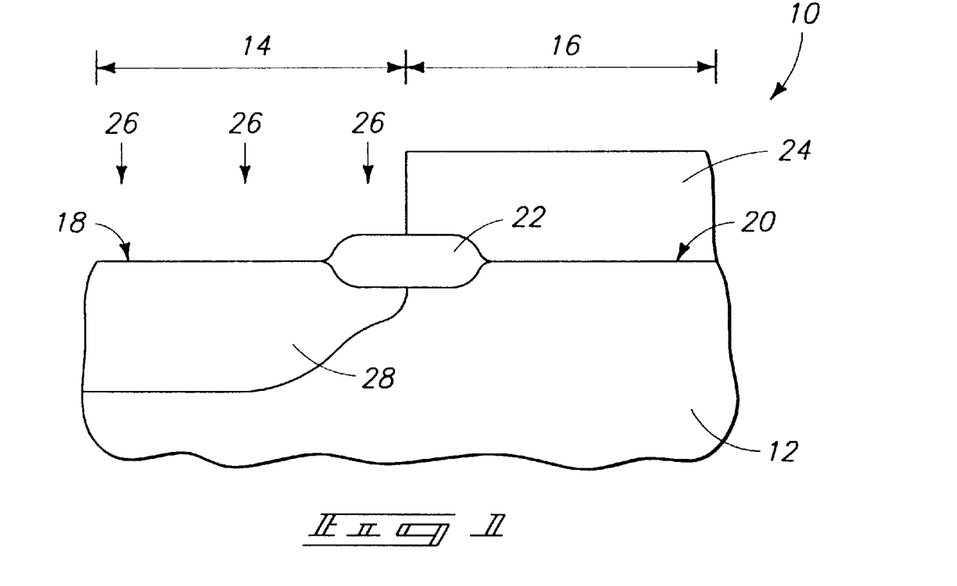
FIG. 1 is a diagrammatic cross-sectional view of a semiconductor wafer fragment at a preliminary processing step in accordance with the present invention.

A process of the present invention is described with reference to FIGS. 1–9. Referring to FIG. 1, a wafer fragment 10 is illustrated at a preliminary processing step of a method of the present invention. Wafer fragment 10 comprises a substrate 12. Substrate 12 comprises a first region 14 and a second region 16. First region 14 is a low-voltage tolerant gate region and second region 16 is a high-voltage tolerant gate region. Ultimately, a low-voltage tolerant gate will be formed over region 14 and a high-voltage tolerant gate will be formed over region 16. In the context of this disclosure and the claims that follow "low-voltage tolerant" and "high-voltage tolerant" are terms defined to be relative to one another, rather than to absolute ranges. Thus, the term "low-voltage tolerant" does not refer to any particular range of voltage tolerance, but instead refers to a device that is tolerant of lower voltages than a corresponding "high-voltage tolerant" device.

First region 14 comprises a first substrate surface 18. Second region 16 comprises a second substrate surface 20. A field oxide 22 separates first substrate surface 18 from second substrate surface 20.

For purposes of the following discussion, a p-type metal-oxide semiconductor (PMOS) is formed over region 14 and an n-type metal-oxide semiconductor (NMOS) is formed over region 16. However, it is to be understood that the locations of the PMOS and NMOS transistors could be reversed. Also, it is to be understood that the conductivity type of a transistor formed over region 16 does not need to differ from the conductivity type of a transistor formed over region 14. Accordingly, PMOS transistors can be formed over both regions 14 and 16. Alternatively, NMOS transistors can be formed over both regions 14 and 16.

Substrate 12 will preferably comprise a semiconductive material, such as monocrystalline silicon, lightly doped with a p-type dopant. To aid in interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A masking layer 24 is formed over second substrate region 16 while leaving first substrate region 14 exposed. Masking layer 24 can comprise photoresist.

After formation of masking layer 24, an n-type dopant 26 is provided within region 14 to form an n-well 28 and to form a threshold voltage implant within substrate region 14. Although n-well 28 is shown being formed after formation of field oxide 22, it is to be understood that n-well 28 could also be formed before field oxide 22. Also, it is to be understood that a threshold voltage implant could be formed in a separate step from a step of forming n-well 28.

Figure 2:
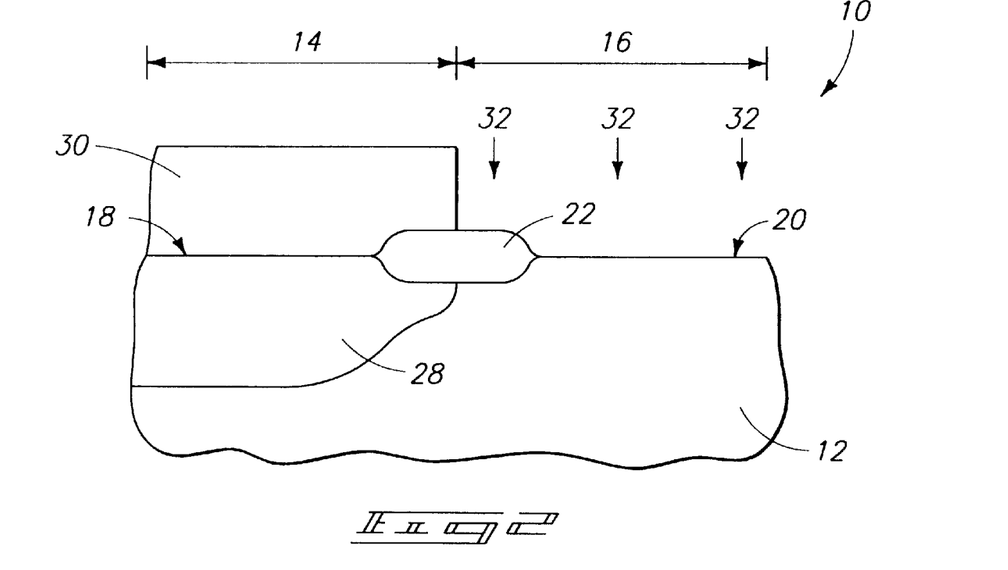
FIG. 2 is a diagrammatic cross-sectional view of the FIG. 1 wafer fragment at a processing step subsequent to that of FIG. 1.

Referring to FIG. 2, masking layer 24 (shown in FIG. 1) is removed from over substrate region 16. Such removal can be accomplished by conventional methods. A masking layer 30 is formed over first substrate region 14, while leaving second substrate region 16 exposed. A p-type dopant 32 is implanted into second substrate region 16 as a threshold voltage adjustment for an NMOS transistor which is to be ultimately formed on region 16. P-type dopant 32 can comprise, for example, boron implanted to a concentration of $1\times10^{16}$ atoms/cm$^3$.

Figure 3:
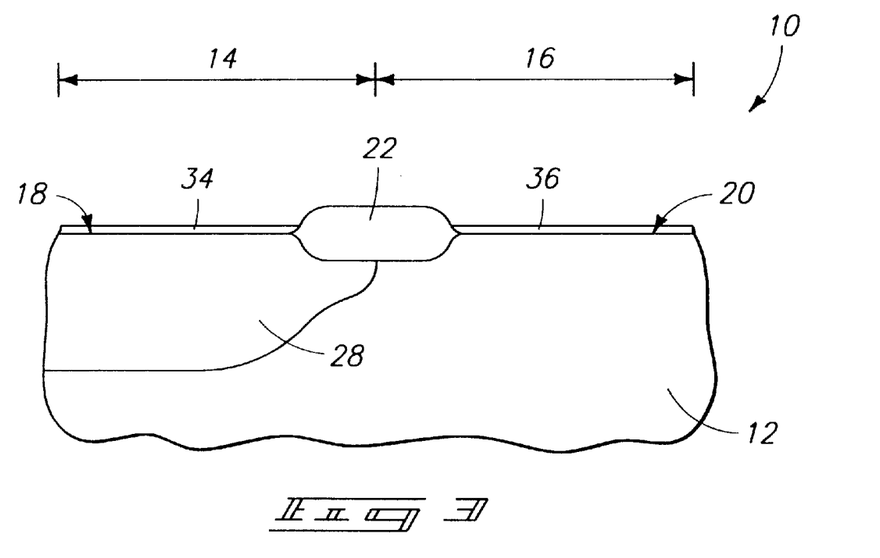
FIG. 3 is a diagrammatic cross-sectional view of the FIG. 1 wafer fragment at a processing step subsequent to that of FIG. 2.

Referring to FIG. 3, masking layer 30 (shown in FIG. 2) is removed. After removal of masking layer 30, substrate surfaces 18 and 20 are preferably cleaned with an SC2 clean. The SC2 clean comprises exposing the surfaces to a mixture of hydrochloric acid, hydrogen peroxide and water (1:1:5, by volume) for a time of about 10 minutes at a temperature of about 80° C.

After the SC2 clean, surfaces 18 and 20 are preferably exposed to an SC1 clean. The SC1 clean comprises exposing the surfaces to ammonium hydroxide, hydrogen peroxide and water (1:2:10, by volume) for a time of about 10 minutes at a temperature of about 50° C.

After the SC1 clean, and in accordance with the present invention, surfaces 18 and 20 are cleaned with a first mixture comprising hydrofluoric acid and hydrochloric acid. Such first mixture will preferably comprise about 100 parts water, from about 15 parts to about 40 parts hydrochloric acid, and from about 1 to about 10 parts hydrofluoric acid (by volume). The first mixture can comprise about 100 parts water, about 20 parts hydrochloric acid and about 1 part hydrofluoric acid (by volume). Alternatively, the first mixture can comprise, for example, water, HCL and HF in ratios of 10:2:1, 10:15:1, or 10:4:1 (by volume).

Surfaces 18 and 20 are exposed to the first mixture for a time of less than or equal to about 12 minutes and at a temperature of about 24° C. The mixture of hydrofluoric acid and hydrochloric acid removes oxide from surfaces 18 and 20. Surfaces 18 and 29 are preferably exposed to the first mixture of hydrofluoric acid and hydrochloric acid for a time of less than two minutes, and most preferably for a time of less than one minute. Suitable cleaning can occur with exposures of from about 15 seconds to about 30 seconds.

Although the cleaning with the first mixture of hydrochloric acid and hydrofluoric acid is described above as cleaning both of surfaces 18 and 20, such cleaning could also encompass cleaning only one of surfaces 18 and 20. To clean only one of surfaces 18 and 20, the other of surfaces 18 and 20 could be masked during such cleaning.

After surfaces 18 and 20 are cleaned with the first mixture comprising hydrofluoric acid and hydrochloric acid, an oxide layer is formed over regions 18 and 20. The oxide layer over region 14 is referred to herein as oxide layer 34, and the oxide layer over second substrate region 16 is referred to herein as oxide layer 36. Oxide layers 34 and 36 may be formed by either depositing oxide over substrate 12, or by growing oxide over substrate 12. Oxide layers 34 and 36 will preferably be formed to a thickness of greater than 100 angstroms, and more preferably to a thickness of about 115 angstroms.

Figure 4:
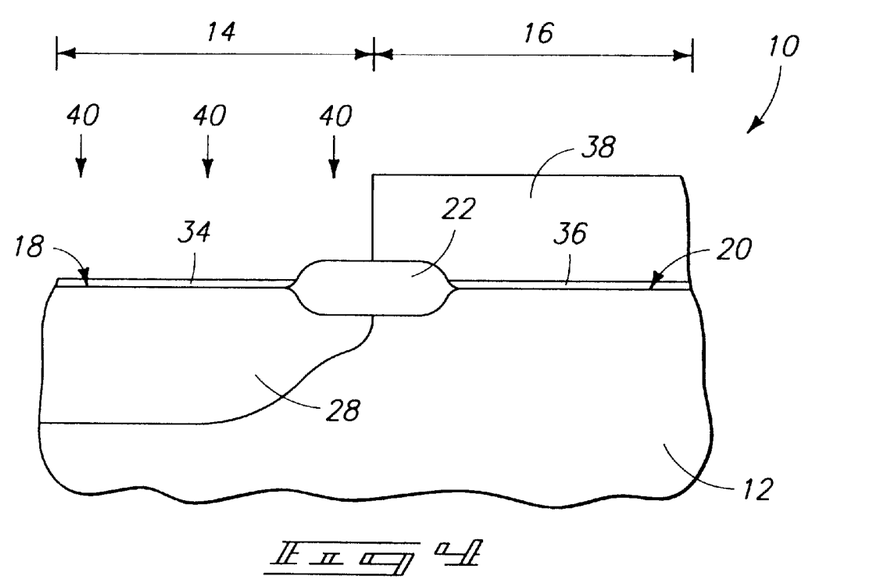
FIG. 4 is a diagrammatic cross-sectional view of the FIG. 1 wafer fragment at a processing step subsequent to that of FIG. 3.

Referring to FIG. 4, a mask 38 is applied over second substrate region 16, leaving first substrate region 14 exposed. An n-type dopant 40 is implanted through oxide layer 34 and into substrate 12. N-type dopant 40 is a threshold voltage adjustment implant. Dopant 40 will, in some circumstances, not be implanted, particularly if there is no need to adjust a threshold voltage of substrate region 14. N-type dopant 40 can comprise, for example, phosphorus, implanted to a concentration of $5\times10^{15}$ atoms/cm$^3$.

Figure 5:
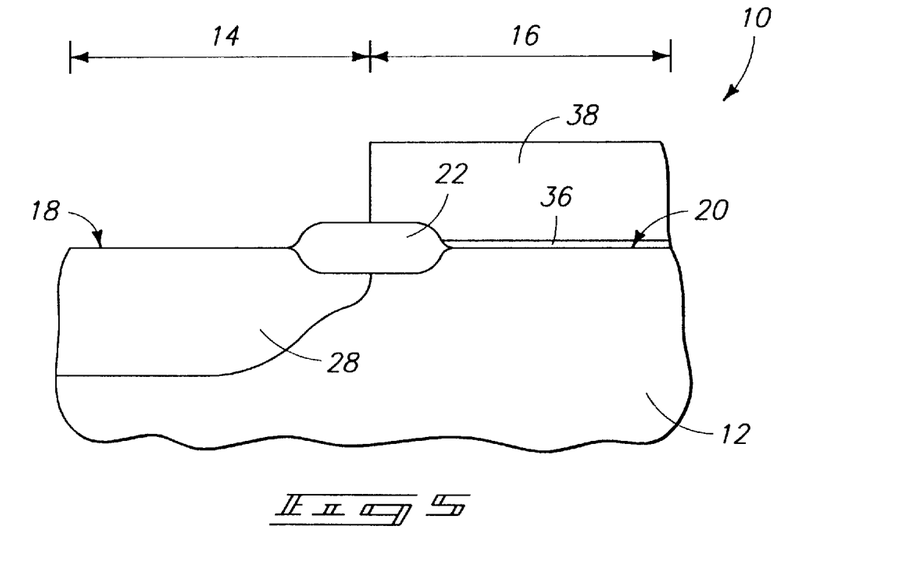
FIG. 5 is a diagrammatic cross-sectional view of the FIG. 1 wafer fragment at a processing step subsequent to that of FIG. 4.

Referring to FIG. 5, oxide layer 34 (shown in FIG. 4) is removed from over substrate region 14. Such removal can comprise, for example, a conventional wet etch utilizing hydrofluoric acid.

Figure 6:
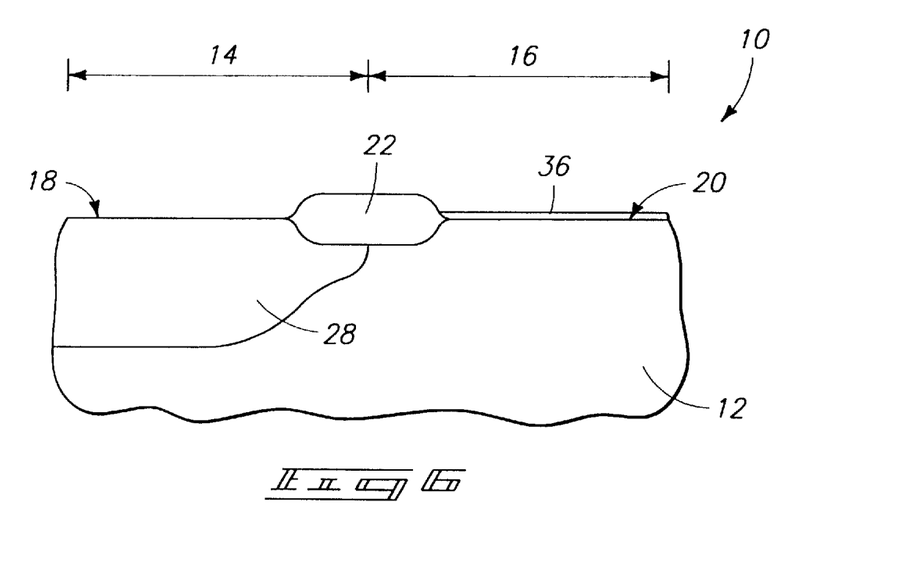
FIG. 6 is a diagrammatic cross-sectional view of the FIG. 1 wafer fragment at a processing step subsequent to that of FIG. 5.

Referring to FIG. 6, mask 38 (shown in FIG. 5) is removed. After removal of mask 38, substrate 12 is preferably exposed to an SC2 clean, followed by an SC1 clean. After the SC1 clean, surface 18 and oxide layer 36 are preferably exposed to a second cleaning utilizing a second mixture comprising hydrofluoric acid and hydrochloric acid. The second mixture of hydrofluoric acid and hydrochloric acid can comprise the same composition as the above-discussed first mixture of hydrochloric and hydrofluoric acid. Substrate surface 18 and oxide layer 36 are preferably exposed to the second mixture of hydrofluoric acid and hydrochloric acid for a time of less than two minutes, and most preferably for a time of less than one minute. Suitable cleaning can occur with exposures of from about 15 seconds to about 30 seconds.

Although the second cleaning with the second mixture comprising hydrofluoric acid and hydrochloric acid is described as occurring after removal of mask 38 (shown in FIG. 5), such cleaning could also occur before removal of mask 38 to localize the cleaning to substrate surface 18.

Figure 7:
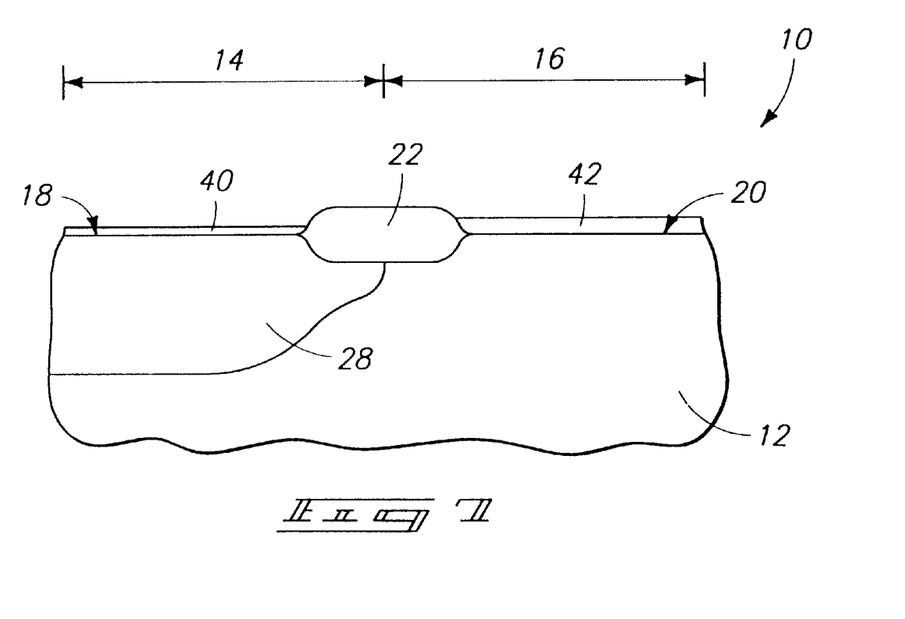
FIG. 7 is a diagrammatic cross-sectional view of the FIG. 1 wafer fragment at a processing step subsequent to that of FIG. 6.

Referring to FIG. 7, a second oxide layer 40 is formed over first substrate layer 18. Second oxide layer 40 preferably comprises silicon dioxide and can be formed by conventional methods of deposition or oxide growth. Second oxide layer 40 can be formed to be from about 70 angstroms to about 80 angstroms thick and preferably is about 76 angstroms thick. During formation of second oxide layer 40, oxide layer 36 (shown in FIG. 6) is preferably exposed so that a second oxide layer is also formed over oxide layer 36 to form a thickened oxide layer 42 over first region 16. Thickened oxide layer 42 preferably comprises a thickness of at least about 135 angstroms.

Figure 8:
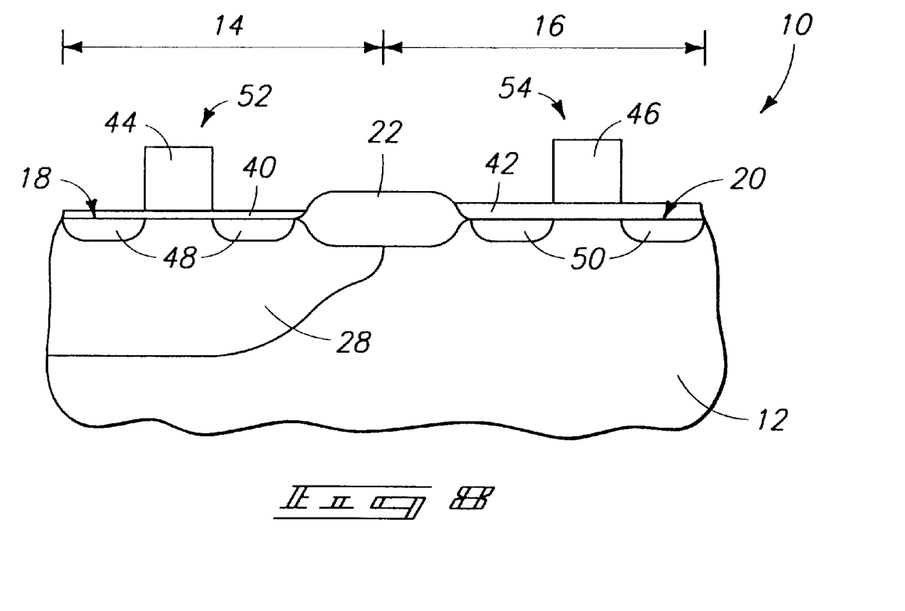
FIG. 8 is a diagrammatic cross-sectional view of the FIG. 1 wafer fragment at a processing step subsequent to that of FIG. 7.

Referring next to FIG. 8, a first transistor gate 44 is formed over first substrate region 14 and a second transistor gate 46 is formed over second substrate region 16. Transistor gates 44 and 46 can be formed by conventional methods. Transistor gates 44 and 46 will comprise a conductive material, such as conductively doped polysilicon. P-type conductivity-enhancing dopant is provided proximate gate 44 to form source/drain regions 48 and complete formation of a PMOS device 52. Also, n-type conductivity-enhancing dopant is provided proximate gate 46 to form source/drain regions 50 and to complete formation of an NMOS transistor 54. NMOS transistor 54 comprises a thick gate oxide layer 42 and thus has a high-voltage tolerant gate. In contrast, PMOS transistor 52 comprises a thin gate oxide layer 40 and thus has a low-voltage tolerant gate. In preferred embodiments of the present invention, gate 44 is a 3.3-volt gate and gate 46 is a 5-volt gate.

Figure 9:
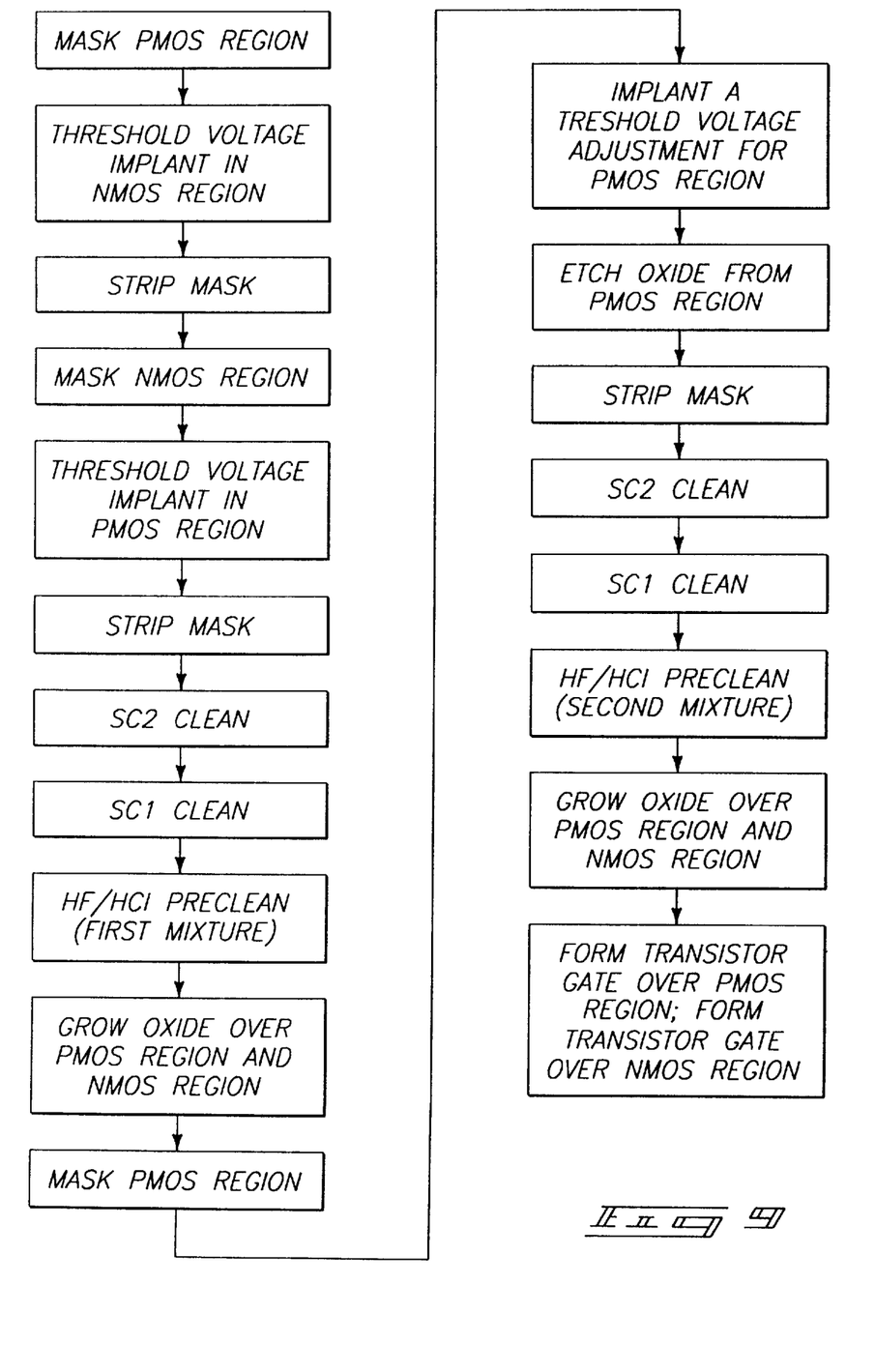
FIG. 9 is a block diagram of a dual gate fabrication process of the present invention.

Referring to FIG. 9, a block diagram is provided, illustrating the steps involved in the above-described FIGS. 1–8 process of the present invention.

Although the described process forms a dual gate structure having a high-voltage tolerant gate and a low-voltage tolerant gate, the present invention also encompasses processes in which dual gate structures are formed wherein both gates have substantially similar voltage tolerances. Such processes can comprise, for example, the steps described with reference to FIGS. 1–3 and 8.

The utilization of a cleaning mixture comprising hydrofluoric acid and hydrochloric acid in processes of the present invention can improve a lifetime of a low-voltage tolerant transistor. Experiments have been conducted comparing a lifetime of a transistor formed over a substrate region treated with a hydrofluoric acid/hydrochloric acid cleaning mixture of the present invention to a device formed over a substrate region which was not treated. Such experiments indicate that the cleaning with a hydrochloric acid/hydrofluoric acid cleaning mixture of the present invention can increase the lifetime of a transistor device by about 30% or greater.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a pair of transistors comprising:
    providing a substrate;
    defining a first region and a second region of the substrate; the first region being a low-voltage tolerant gate region and the second region being a high-voltage tolerant gate region; the first region and second region comprising a first substrate surface and a second substrate surface, respectively;
    improving a lifetime of a low voltage tolerant transistor formed proximate the first substrate surface by cleaning the first substrate surface with a first mixture comprising hydrofluoric acid and hydrochloric acid;
    forming a first transistor gate over the first substrate region and incorporating the first transistor gate into the low-voltage tolerant transistor; and
    forming a second transistor gate over the second substrate region and incorporating the second transistor gate into a high-voltage tolerant transistor.

2. The method of claim 1 further comprising:
    after cleaning the first substrate surface with the first mixture, forming oxide over the first substrate surface;
    removing the oxide from the first substrate surface; and
    after removing the oxide, cleaning the first substrate surface with a second mixture comprising hydrofluoric acid and hydrochloric acid.

3. The method of claim 1 wherein the first substrate surface is exposed to the first mixture for less than about 2 minutes.

4. The method of claim 1 wherein the first substrate surface is exposed to the first mixture for less than about 1 minute.

5. The method of claim 1 wherein the first mixture comprises about 100 parts water, from about 15 parts to about 40 parts HCL, and from about 1 to about 10 parts HF (by volume).

6. The method of claim 1 wherein the first mixture comprises about 100 parts water, about 20 parts HCL, and about 1 part HF (by volume).

7. A method of forming a pair of transistors comprising:
    providing a substrate;
    defining a first region and a second region of the substrate; the first region and second region comprising a first substrate surface and a second substrate surface, respectively;
    cleaning at least one of the first and second substrate surfaces with a first mixture comprising hydrofluoric acid and hydrochloric acid;
    after cleaning the at least one of the first and second substrate surfaces, forming a first oxide layer over the first and second substrate surfaces;
    removing the first oxide layer from over the first substrate surface while leaving the first oxide layer over the second substrate surface;
    forming a second oxide layer over the first substrate surface;
    after forming the second oxide layer, forming a first transistor gate over the first substrate region; and
    after forming the first oxide layer, forming a second transistor gate over the second substrate region.

8. The method of claim 7 further comprising:
    incorporating the first transistor gate into a first transistor having a first voltage tolerance;
    incorporating the second transistor gate into a second transistor having a second voltage tolerance; and wherein the second voltage tolerance is different than the first voltage tolerance.

9. The method of claim 7 further comprising incorporating one of the first and second transistor gates into a PMOS transistor and incorporating an other of the first and second transistor gates into an NMOS transistor.

10. The method of claim 7 further comprising incorporating both of the first and second transistor gates into PMOS transistors.

11. The method of claim 7 further comprising incorporating both of the first and second transistor gates into NMOS transistors.

12. The method of claim 7 wherein the cleaning comprises exposing both of the first and second substrate surfaces to the first mixture.

13. The method of claim 7 wherein the cleaning comprises exposing the at least one of the first and second substrate surfaces to the mixture of hydrofluoric acid and hydrochloric acid for a time of less than about 2 minutes.

14. The method of claim 7 further comprising:
after removing the first oxide layer from the first substrate surface, cleaning the first substrate surface with a second mixture comprising hydrofluoric acid and hydrochloric acid.

15. The method of claim 7 further comprising:
after removing the first oxide layer from the first substrate surface, cleaning the first substrate surface with a second mixture comprising hydrofluoric acid and hydrochloric acid, and wherein the first mixture and the second mixture comprise a same composition.

16. The method of claim 7 further comprising:
after removing the first oxide layer from the first substrate surface, cleaning the first substrate surface with a second mixture comprising hydrofluoric acid and hydrochloric acid, and wherein the first mixture and the second mixture comprise about 100 parts water, from about 15 parts to about 40 parts HCL, and from about 1 to about 10 parts HF (by volume).

17. The method of claim 7 wherein the second oxide layer is formed over the first oxide layer over the second substrate surface.

18. The method of claim 7 wherein the second oxide layer is formed by growing the second oxide layer.

19. The method of claim 7 wherein the second oxide layer is formed by depositing the second oxide layer.

20. A method of forming a pair of transistors having different voltage tolerances comprising:
providing a substrate;
defining a first region and a second region of the substrate; the first region being a low-voltage tolerant gate region and the second region being a high-voltage tolerant gate region; the first region and second region comprising a first substrate surface and a second substrate surface, respectively;
first cleaning at least one of the first and second substrate surfaces with a first mixture comprising hydrofluoric acid and hydrochloric acid;
after first cleaning the at least one of the first and second substrate surfaces, forming a first oxide layer over the first and second substrate surfaces;
removing the first oxide layer from over the first substrate surface while leaving the first oxide layer over the second substrate surface;
after removing the first oxide layer, second cleaning the first substrate surface with a second mixture comprising hydrofluoric acid and hydrochloric acid;
forming a second oxide layer over the first substrate surface; after forming the second oxide, the first substrate surface being covered with oxide to a first thickness and the second substrate surface being covered with oxide to a second thickness which is greater than the first thickness;
after forming the second oxide layer, forming a first transistor gate over the first substrate region and forming first source/drain regions proximate the first transistor gate; and
after forming the first oxide layer, forming a second transistor gate over the second substrate region and forming second source/drain regions proximate the second transistor gate.

21. The method of claim 20 further comprising incorporating one of the first and second transistor gates into a PMOS transistor and incorporating an other of the first and second transistor gates into an NMOS transistor.

22. The method of claim 20 further comprising incorporating both of the first and second transistor gates into PMOS transistors.

23. The method of claim 20 further comprising incorporating both of the first and second transistor gates into NMOS transistors.

24. The method of claim 20 wherein the first cleaning comprises exposing both of the first and second substrate surfaces to the first mixture.

25. The method of claim 20 wherein the second oxide layer is formed over the first oxide layer over the second substrate surface.

26. The method of claim 20 wherein the second transistor gate is formed after forming the second oxide layer.

27. The method of claim 20 wherein the second oxide layer is formed over the first oxide layer over the second substrate surface, and wherein the second transistor gate is formed after forming the second oxide layer.

28. The method of claim 20 wherein the first mixture and the second mixture comprise a same composition.

29. The method of claim 20 wherein the first mixture and the second mixture comprise about 100 parts water, from about 15 parts to about 40 parts HCL, and from about 1 to about 10 parts HF (by volume).

30. A method of forming a pair of transistors having different voltage tolerances comprising:
providing a substrate;
defining a first region and a second region of the substrate; the first region being a low-voltage tolerant gate region and the second region being a high-voltage tolerant gate region; the first region and second region comprising a first substrate surface and a second substrate surface, respectively;
forming threshold voltage implants in both the first and second regions;
first cleaning both of the first and second substrate surfaces with a first mixture comprising hydrofluoric acid and hydrochloric acid to remove oxide and getter metals from the first and second substrate surfaces;
after first cleaning the first and second substrate surfaces, forming a first oxide layer over the first and second substrate surfaces;
masking the first oxide over the second substrate surface while leaving the first oxide over the first substrate surface exposed;
with the masking in place, providing a threshold voltage adjustment implant through the first oxide layer and into the first substrate region, and removing the first oxide layer from over the first substrate surface while leaving the first oxide layer over the second substrate surface;

after removing the first oxide layer, removing the masking;

after removing the masking, cleaning the first substrate surface with a cleaning solution comprising hydrochloric acid and hydrogen peroxide;

after cleaning the first substrate surface with the cleaning solution, second cleaning the first substrate surface with a second mixture comprising hydrofluoric acid and hydrochloric acid to remove oxide and getter metals from the first substrate surface;

after second cleaning the first substrate surface, forming a second oxide layer over the first substrate surface and over the first oxide layer over the second substrate surface; after forming the second oxide, the first substrate surface being covered with oxide to a first thickness and the second substrate surface being covered with oxide to a second thickness which is greater than the first thickness;

after forming the second oxide layer, forming a first transistor gate over the first substrate region and forming first source/drain regions proximate the first transistor gate; and after forming the second oxide layer, forming a second transistor gate over the second substrate region and forming second source/drain regions proximate the second transistor gate.

31. The method of claim 30 further comprising incorporating one of the first and second transistor gates into a PMOS transistor and incorporating an other of the first and second transistor gates into an NMOS transistor.

32. The method of claim 30 further comprising incorporating both of the first and second transistor gates into PMOS transistors.

33. The method of claim 30 further comprising incorporating both of the first and second transistor gates into NMOS transistors.

34. The method of claim 30 wherein the first mixture and the second mixture comprise a same composition.

35. The method of claim 30 wherein the first mixture and the second mixture comprise about 100 parts water, from about 15 parts to about 40 parts HCL, and from about 1 to about 10 parts HF (by volume).

* * * * *